United States Patent
Amick et al.

(10) Patent No.: US 7,107,475 B1
(45) Date of Patent: Sep. 12, 2006

(54) DIGITAL DELAY LOCKED LOOP WITH EXTENDED PHASE CAPTURE RANGE

(75) Inventors: Brian Amick, Brookline, MA (US); Dong Joon Yoon, San Jose, CA (US); Tri Tran, San Leandro, CA (US); Gajendra Singh, Sunnyvale, CA (US); Aparna Ramachandran, Sunnyvale, CA (US); Claude Gauthier, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 419 days.

(21) Appl. No.: 10/690,302

(22) Filed: Oct. 21, 2003

(51) Int. Cl.
*G06F 1/12* (2006.01)
(52) U.S. Cl. ...................................... 713/401; 327/158
(58) Field of Classification Search ................ 327/158; 375/376; 713/401
See application file for complete search history.

(56) References Cited

U.S. PATENT DOCUMENTS

| | | | |
|---|---|---|---|
| 5,875,219 A * | 2/1999 | Kim | 375/376 |
| 6,316,976 B1 * | 11/2001 | Miller et al. | 327/156 |
| 6,683,928 B1 * | 1/2004 | Bhullar et al. | 375/374 |

* cited by examiner

*Primary Examiner*—Chun Cao
*Assistant Examiner*—Albert Wang
(74) *Attorney, Agent, or Firm*—Osha Liang LLP

(57) ABSTRACT

A digital delay locked loop uses a delay array to delay an input signal by an amount indicated by a delay code. A phase of the resulting delayed signal is compared to a corresponding phase of the input signal, and dependent on the comparison, the delay code is updated to indicate whether the delay array needs to provide more delay or less delay. The digital delay locked loop also uses a detection circuit that monitors for a predetermined condition of the delay code. In response to detection of the predetermined condition, the delay code is automatically reset to a value different than a value of the delay code present at a previous reset or initial startup of the digital delay locked loop.

20 Claims, 6 Drawing Sheets

DIGITAL DELAY LOCKED LOOP WITH EXTENDED PHASE CAPTURE RANGE

BACKGROUND OF INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as SYS_CLK) to various parts of the computer system 10. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

Accordingly, as the frequencies of modern computers continue to increase, the need to rapidly transmit data between circuit interfaces also increases. To accurately receive data, a clock signal is often transmitted to help recover data transmitted to a receiving circuit by some transmitting circuit. The clock signal determines when the data should be sampled by the receiving circuit. In some cases, the clock signal may change state at the beginning of the time the data is valid. However, this is typically undesirable because the receiving circuit operates better when the clock signal is detected during the middle of the time the data is valid. In other cases, the clock signal may degrade as it propagates from its transmission point. Such degradation may result from process, voltage, and/or temperature conditions that directly or indirectly affect the clock signal. To guard against the adverse effects of poor and inaccurate clock signal transmission, a delay locked loop ("DLL") is commonly used to generate a copy of the clock signal at a fixed phase shift with respect to the original clock signal.

FIG. 2 shows a portion of a typical computer system in which a DLL 30 is used. In FIG. 2, data 32 is transmitted from a transmitting circuit 34 to a receiving circuit 36. To aid in the recovery of the data 32 by the receiving circuit 36, a clock signal 38 is transmitted along with the data 32. To ensure that the data 32 is properly latched by the receiving circuit 36, the DLL 30 (which in FIG. 2 is shown as being part of the receiving circuit 36) regenerates the clock signal 38 to a valid voltage level and creates a phase shifted version of the clock signal 38. Accordingly, the use of the DLL 30 in this fashion ensures (1) that the data 32 is properly latched by triggering the receiving circuit 36 at a point in time in which the data 32 is valid and (2) that the clock signal 38 is buffered by the receiving circuit 36.

DLLs, as suggested above, are widely used in the interfaces between integrated circuits (e.g., memory circuits, microprocessors, etc.). Various DLL architectures (e.g., digital DLLs, analog DLLs, open loop DLLs, closed loop DLLs, etc.) have been implemented to achieve fast locking, low jitter, and robust operation across a wide range of process, voltage, and temperature (PVT) conditions.

SUMMARY OF INVENTION

According to one aspect of one or more embodiments of the present invention, a computer system comprises a delay array arranged to generate an output signal that is delayed with respect to an input signal by an amount indicated by a delay code provided to the delay array, a shift controller operatively connected to the delay array arranged to update the delay code dependent on a phase comparison of the input signal and the output signal, and a detection circuit arranged to monitor the delay code, where, the detection circuit, in response to a predetermined condition of the delay code, causes a self-reset of the delay code to a value different than that of a value of the delay code at one of a previous reset and an initial startup of the delay array.

According to one aspect of one or more embodiments of the present invention, a computer system comprises means for delaying an input signal to generate an output signal, the means for delaying being dependent on a delay code indicative of an amount of delay by which to delay the input signal, means for comparing phases of the input signal and the output signal, means for updating the delay code dependent on the means for comparing phases, means for monitoring the delay code, and means for resetting the delay code in response to a detected predetermined condition of the delay code, where the delay code is reset to a value different than a value of the delay code present at one of a previous reset and an initial startup of the means for delaying.

According to one aspect of one or more embodiments of the present invention, a method for performing delay locked loop operations comprises: delaying an input signal to generate an output signal, where the output signal is delayed with respect to the input signal by an amount indicated by a delay code; comparing phases of the input signal and the output signal; updating the delay code dependent on the comparing; and monitoring the delay code for a predetermined condition, where, in response to detecting the predetermined condition, resetting the delay code to a value different than a value of the delay code present at least at a previous reset and initial startup of the delaying.

Other aspects and advantages of the invention will be apparent from the following description and the appended claims.

DETAILED DESCRIPTION

Figure 1:
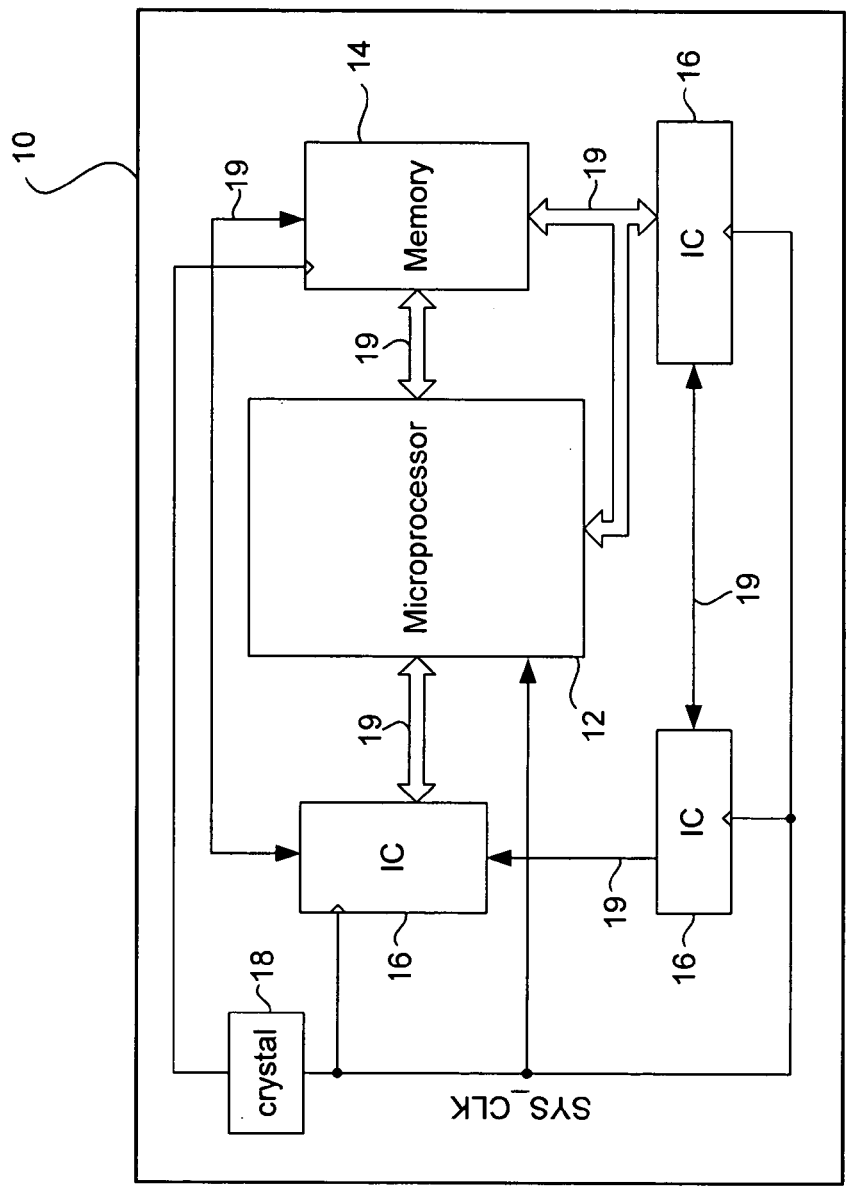
FIG. 1 shows a typical computer system.
Figure 2:
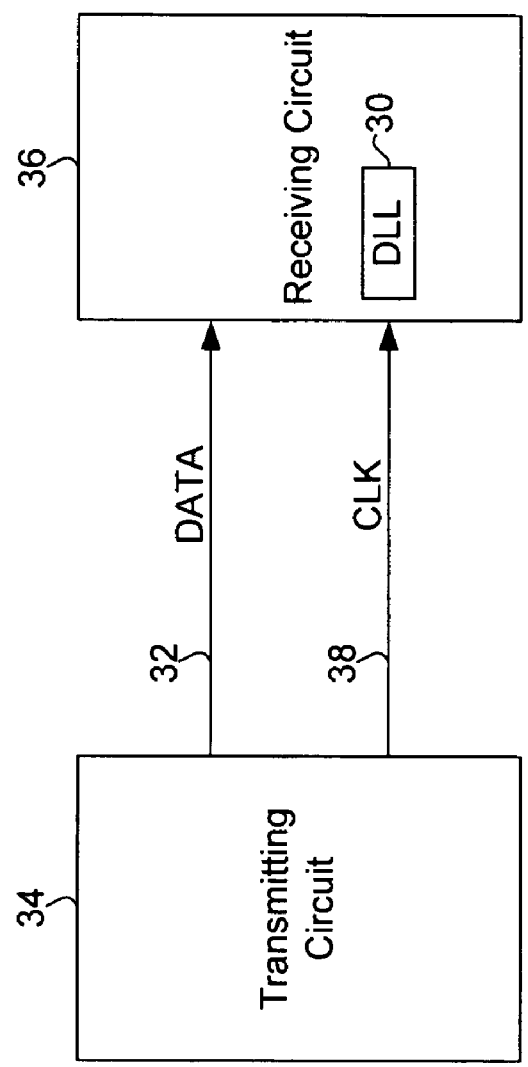
FIG. 2 shows a portion of a typical computer system in which a DLL is used.
Figure 3:
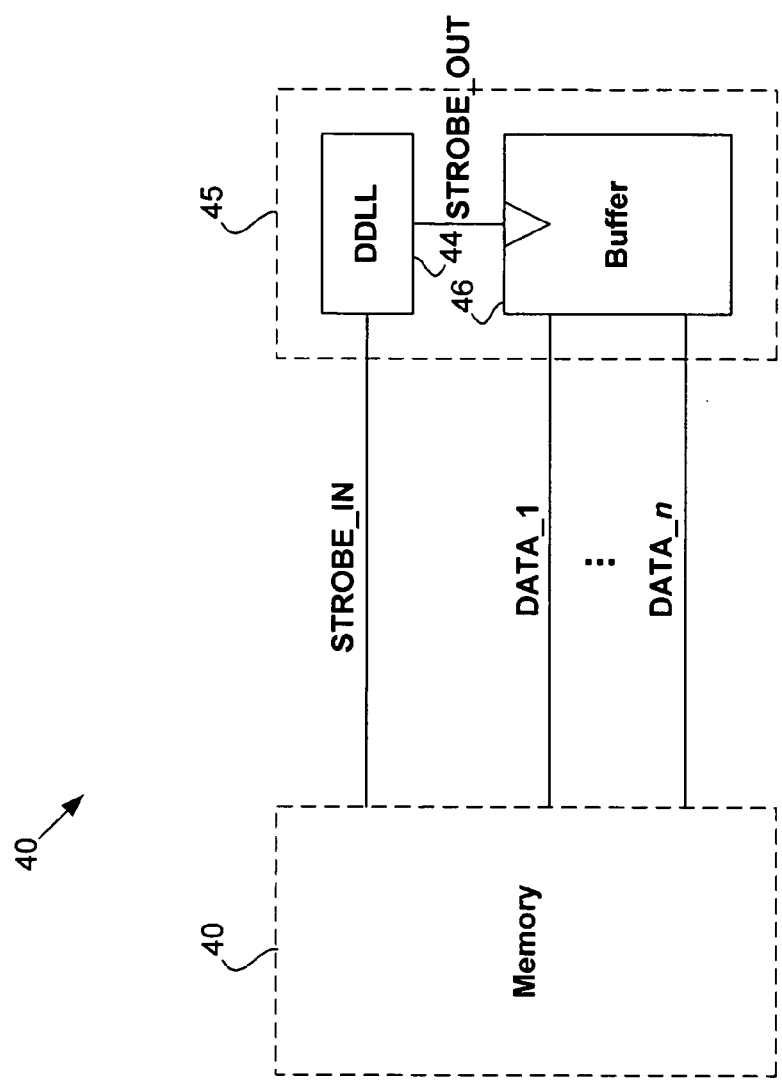
FIG. 3 shows an interface between a microprocessor and memory in accordance with an embodiment of the present invention.

FIG. 3 shows an exemplary interface in which a digital delay locked loop in accordance with an embodiment of the present invention may be used.

Specifically, FIG. 3 shows an interface 40 between memory 42 and a microprocessor 45. During a memory read operation, a memory strobe signal STROBE_IN is delayed by a digital delay locked loop 44 residing in the microprocessor 45. The resulting delayed memory strobe signal STROBE_OUT is used to drive a receiving flip-flop 46 residing in the microprocessor 45. Such a configuration allows the microprocessor 45 to read in data DATA_1 . . . DATA_n from the memory 42 at a fixed delay of the memory strobe signal STROBE_IN.

Figure 4:
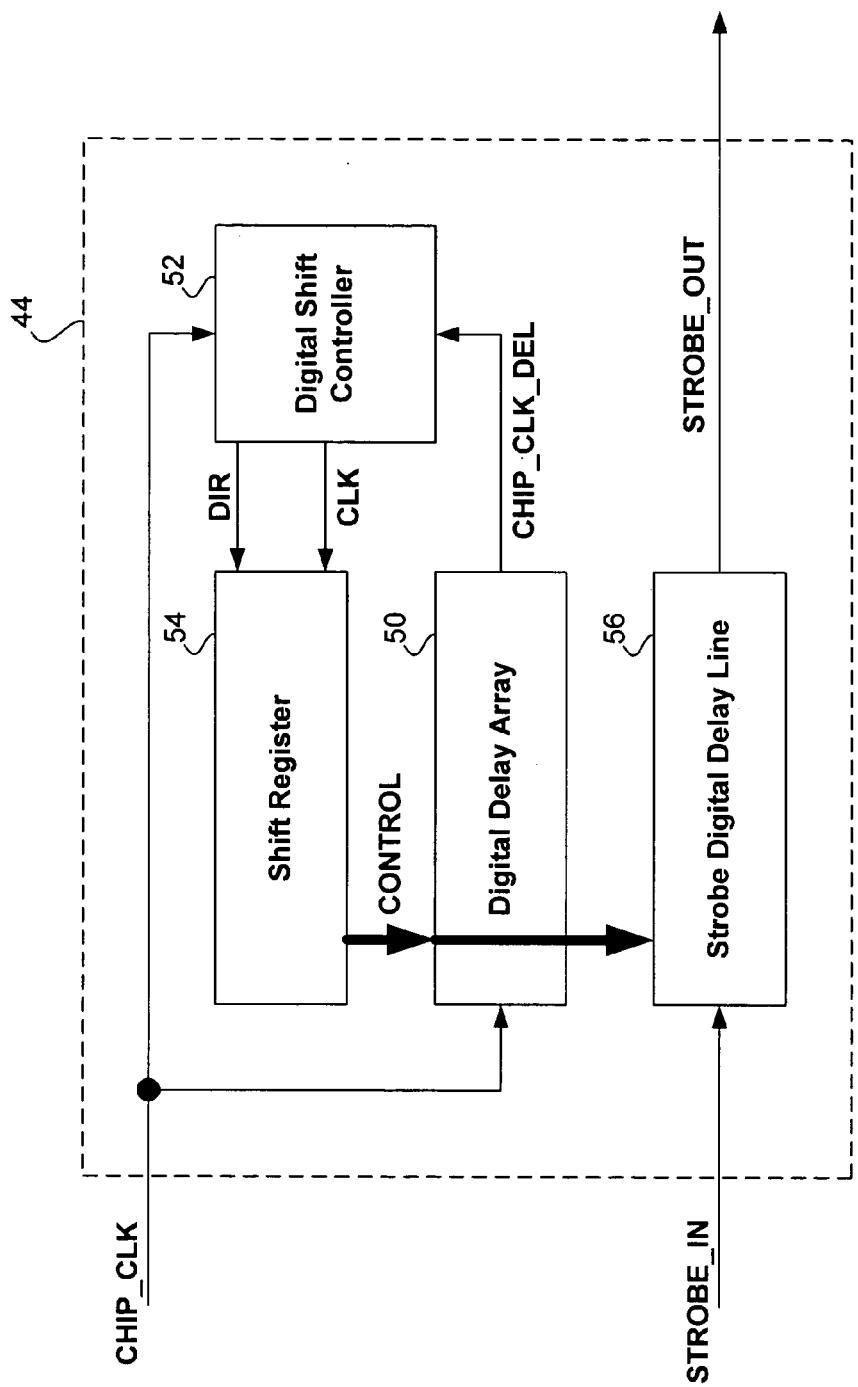
FIG. 4 shows a digital delay locked loop in accordance with an embodiment of the present invention.

FIG. 4 shows an exemplary digital delay locked loop 44 in accordance with an embodiment of the present invention. In FIG. 4, a chip clock CHIP_CLK serves as an input to a digital delay array 50. The digital delay array 50 outputs a delayed chip clock CHIP_CLK_DEL to a digital shift controller 52.

In one or more embodiments, the digital delay array 50 may comprise a plurality of delay lines. One or more of these delay lines may comprise a filter to remove glitches that occur in the delay lines.

The digital shift controller 52, in addition to inputting the delayed chip clock CHIP_CLK_DEL, inputs the chip clock CHIP_CLK. The digital shift controller 52 comprises digital logic circuitry, of which a phase comparator (discussed and shown below in reference to FIG. 5) is used to determine if the delayed chip clock CHIP_CLK_DEL is in phase (i.e., delayed by the proper amount of time) with the chip clock CHIP_CLK. In other words, the digital shift controller 52 determines whether the delay of the digital delay array 50 is more or less than a desired amount.

Dependent on the phase comparison of the delayed chip clock CHIP_CLK_DEL and the chip clock CHIP_CLK, the digital shift controller 52 outputs a direction signal DIR and a clock signal CLK to a shift register 54.

The shift register 54 shifts/updates a delay code (e.g., a thermometer code) based on the direction signal DIR and the clock signal CLK from the digital shift controller 52. The delay code stored in the shift register 54 is the basis for generating control signals CONTROL to the digital delay array 50 and a strobe digital delay line 56. The delay code, via the control signals CONTROL, effectively controls the amount of delay cells that are activated within the respective digital delay array 50 and strobe digital delay line 56.

The strobe digital delay line 56 is used to delay a memory strobe signal STROBE_IN by a fixed amount in relationship to a delay of the digital delay array 50, thereby producing a delayed memory strobe signal STROBE_OUT (refer to discussion above with reference to FIG. 3). Thus, the strobe digital delay line 56 and the digital delay array 50 are both controlled by bits on the control signals CONTROL.

In one embodiment of the present invention, more 1s in the delay code stored in the shift register 54 may result in the activation of a decreased number of delay cells in the digital delay array 50 and the strobe digital delay line 56, thereby reducing the amount of delay of the digital delay array 50 and the digital delay line 56. In another embodiment of the present invention, more 1s in the delay code stored in the shift register 54 may result in the activation of an increased number of delay cells in the digital delay array 50 and the strobe digital delay line 56, thereby increasing the amount of delay of the digital delay array 50 and the digital delay line 56.

Figure 5:
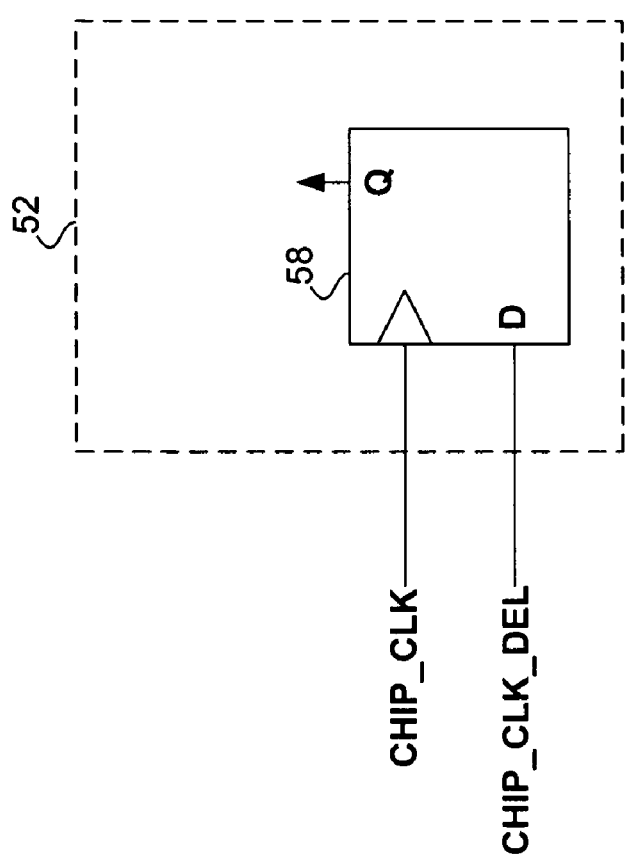
FIG. 5 shows a digital shift controller of a digital delay locked loop.

FIG. 5 shows an exemplary digital shift controller 52 of a digital delay locked loop 44 in accordance with an embodiment of the present invention. In order to compare phases of the chip clock CHIP_CLK and the delayed chip clock CHIP_CLK_DEL, the digital shift controller 52 uses a D flip-flop 58 as a phase comparator. The chip clock CHIP_CLK is connected to the clock input of the D flip-flop 58 and the delayed chip clock CHIP_CLK_DEL is connected to the D input of the D flip-flop 58. Thus, a positive edge on the chip clock CHIP_CLK triggers the D flip-flop 58, at which point the D flip-flop 58 latches and outputs the value at its D input.

In the exemplary embodiment of the digital shift controller 52 shown in FIG. 5, the D flip-flop 58 is a positive edge-triggered flip-flop. However, in other embodiments of the present invention, various other circuits may be used for phase comparison purposes. For example, in some embodiments of the present invention, a dual-edge or negative-edge triggered flip-flop may be used.

Typical phase comparators, such as the D flip-flop 58 shown in FIG. 5, can be used to compare phases between −180 and +180 degrees (i.e., ±π). Thus, they have a limited phase capture range. If a delay of a particular delay element (e.g., digital delay array 50 shown in FIG. 4) is outside the phase capture range of a desired delay point at digital delay locked loop reset and startup, an incorrect interpretation of a phase comparison may occur, thereby leading to failure of the digital delay locked loop. For example, in cases in which the delay is outside the phase capture range of a phase comparator, the digital delay locked loop may interpret the phase comparison to mean that more delay is needed, when, in reality, less delay is needed. Alternatively, the digital delay locked loop may interpret the phase comparison to mean that less delay is needed, when, in reality, more delay is needed.

Such incorrect interpretations become more prevalent and problematic as circuits experience a broad range of PVT conditions. In typical implementations, a digital delay locked loop is designed to provide a desired delay for nominal PVT conditions at the reset and startup of the digital delay locked loop. Any deviation from nominal PVT conditions at reset and startup must not cause the delay of a delay line/array of the digital delay locked loop to be outside ±π of a desired delay point. Otherwise, the digital delay locked loop may fail to work properly.

Figure 6:
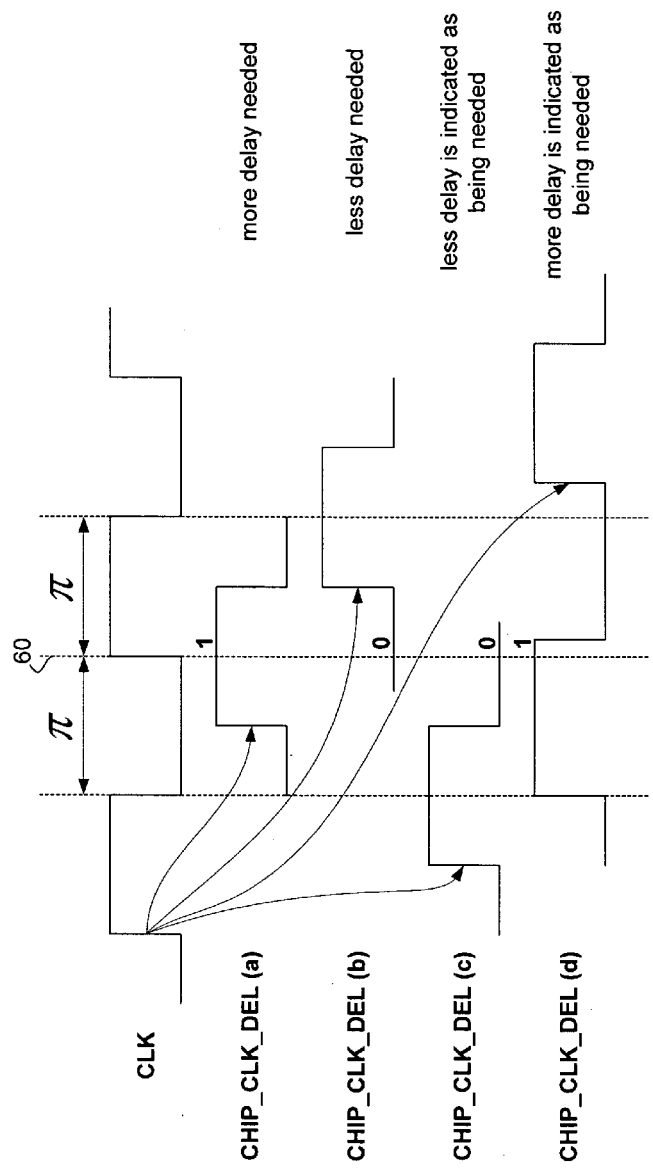
FIG. 6 shows timing diagrams associated with phase comparison of signals by the digital shift controller shown in FIG. 5.

FIG. 6 shows timing diagrams associated with phase comparison of signals by the D flip-flop phase comparator 58 shown in FIG. 5. In FIG. 6, a waveform for the chip clock CHIP_CLK is shown. Recall that the chip clock CHIP_CLK serves as the clock input to the D flip-flop 58. A desired delay point is indicated by the line 60. Further, a phase capture range of the D flip-flop 58 is indicated by the 180 degrees (π) intervals before and after the desired delay point 60.

In a first case, represented by the waveform (a), when a positive edge of the delayed chip clock CHIP_CLK_DEL occurs in the π interval before the desired delay point 60, a '1' is latched at the subsequent positive edge of the chip clock CHIP_CLK. This '1' indicates that more delay is needed in order to delay the delayed chip clock CHIP_CLK_DEL to the desired delay point 60.

In a second case, represented by the waveform (b), when a positive edge of the delayed chip clock CHIP_CLK_DEL occurs in the π interval after the desired delay point 60, a '0' is latched at the prior positive edge of the chip clock CHIP_CLK. This '0' indicates that less delay is needed in order to delay the delayed chip clock CHIP_CLK_DEL to the desired delay point 60.

Thus, in both of the previous two cases, the delay of the delayed chip clock CHIP_CLK_DEL was between ±π of the desired delay point 60 (i.e., was within the phase capture range of the D flip-flop phase comparator 58 shown in FIG. 5).

In a third case, represented by the waveform (c), a positive edge of the delayed chip clock CHIP_CLK_DEL occurs before the π interval prior to the desired delay point 60. Thus, the delay of the delayed chip clock CHIP_CLK_DEL is outside the phase capture region of the D flip-flop type phase comparator 58 (shown in FIG. 5). As shown in FIG. 6, in this case, a '0' is latched at the subsequent positive edge of the chip clock CHIP_CLK. This '0' is then interpreted as less delay being needed. In actuality, however, more delay is needed.

In a fourth case, represented by the waveform (d), a positive edge of the delayed chip clock CHIP_CLK_DEL occurs after the π interval after the desired delay point 60. Thus, the delay of the delayed chip clock CHIP_CLK_DEL is outside the phase capture region of the D flip-flop type phase comparator 58 (shown in FIG. 5). As shown in FIG. 6, in this case, a '1' is latched at the prior positive edge of the chip clock CHIP_CLK. This '1' is then interpreted as more delay being needed. In actuality, however, less delay is needed.

Thus, in these last two cases, the delay of the delayed chip clock CHIP_CLK_DEL is outside the phase capture range of the D flip-flop phase comparator 58 (shown in FIG. 5), which, in turn, leads to incorrect interpretation as to whether more or less delay is needed. Such incorrect interpretation may lead to failure of the digital delay locked loop.

One or more embodiments of the present invention generally relate to a digital delay locked loop 44 (shown in FIGS. 3 and 4) that is designed to prevent incorrect phase comparator interpretation from leading to failure of the digital delay locked loop 44 (shown in FIGS. 3 and 4). In essence, one or more embodiments of the present invention relate to a digital delay locked loop 44 (shown in FIGS. 3 and 4) that includes one or more features for extending the phase capture range of the digital delay locked loop 44 (shown in FIGS. 3 and 4).

Referring to FIG. 4 and the D flip-flop phase comparator 58 shown in FIG. 5 above, a delay of the digital delay array 50, $T_A$, should be as follows:

$$(0.5+D)*T_{CHIP\_CLK} \leq T_A \leq (1.5-D)*T_{CHIP\_CLK},$$

where D represents a duty cycle error of the chip clock CHIP_CLK and $T_{CHIP\_CLK}$ represents a period of the chip clock CHIP_CLK. This relationship is equivalent to $T_A$ being within ±π of a desired delay point on the chip clock CHIP_CLK including variability of a duty cycle error of the chip clock CHIP_CLK.

It follows that in order for the delay of the digital delay array 50, $T_A$, to be within the range expressed above, and thus, ensure proper lock at reset and startup of the digital delay locked loop 44, the PVT variation of a delay cell, $T_C$, in the digital delay array 50 can only vary by:

$$\Delta T_C = \frac{1.5 - D}{0.5 + D}.$$

In order to meet this constraint to the extent possible, one or more embodiments of the present invention use a reset code to selectively update a delay code stored in the shift register 54. Recall that the delay code stored in the shift register 54 is dependent on the phase comparisons made by the phase comparator(s) 58 (shown in FIG. 5) in the digital shift controller 52.

In one exemplary embodiment of the present invention, a '0' in a delay code stored in the shift register 54 causes a deactivation of one or more delay cells and a '1' in a delay code stored in the shift register 54 causes an activation of one or more delay cells. In this embodiment of the present invention, the delay code stored in the shift register 54 is reset such that across any of the PVT conditions, the delay of the digital delay array 50 is never too long that it is misinterpreted (refer to waveform (d) shown in FIG. 6).

In this particular implementation, the delay code stored in the shift register 54 is designed to have a relatively few number of 1's at reset and startup of the digital delay locked loop 44. Thus, across all PVT conditions, at reset and startup, the delay of the digital delay array 50 is either (1) interpreted correctly (for cases represented by waveforms (a) and (b) shown in FIG. 6) or (2) a short delay is interpreted incorrectly as even less delay being needed (for case represented by waveforms (c) shown in FIG. 6).

Those skilled in the art will appreciate in this embodiment, the case represented by waveform (d) in FIG. 6 is avoided. However, in other embodiments of the present invention, one or more of the other cases shown in FIG. 6 may also be avoided.

In the latter case, in which the delay is incorrectly interpreted, the delay code eventually will become all 0's because the digital delay locked loop 44 will interpret the delay of the digital delay array 50 as being too long, when, in actuality, the delay is too short. In response to such an occurrence, a detection, or monitoring, circuit (not shown) configured to effectively monitor the delay code issues a reset (also referred to as "self-reset") that selectively updates/resets the delay code to a value that indicates that more delay is needed than the amount of delay needed as indicated by the delay code at the initial reset/startup of the digital delay locked loop 44. In other words, in response to the delay code becoming all 0's, the digital delay locked loop 44, by way of the detection circuit (not shown), self-resets the delay code to having more 1's than the delay code had at the initial reset/startup of the digital delay locked loop 44.

In fast PVT corners, the delay code may become all 1's. This fact may be used to determine the self-reset value of the delay code. The PVT range covered by the initial and self-reset delay code values are individually smaller than an entire PVT range. However, a sum of the PVT range and other errors covered by the initial and self-reset delay code values is greater than the entire PVT and error range. Thus, the phase capture range, or the lock range, of the digital delay locked loop 44 is extended outside of the ±π phase capture range discussed above.

In other embodiments of the present invention, a '0' in a delay code stored in the shift register 54 may cause the activation of an increased number of delay cells and a '1' in a delay code stored in the shift register 54 may cause a deactivation of a decreased number of delay cells. Those skilled in the art will appreciate that the value of the delay code will change according to whether 0's and 1's indicate more or less delay being needed.

In one or more embodiments of the present invention, the detection circuit (not shown) referred to above may be part of the digital shift controller 52. However, in other embodiments of the present invention, the detection circuit (not shown) may be disposed elsewhere as part of the digital delay locked loop 44.

Advantages of the present invention may include one or more of the following. In one or more embodiments, because a phase capture range of a digital delay locked loop is extended past ±π (±180 degrees), the digital delay locked loop is functional across a greater range of PVT conditions.

In one or more embodiments, because a phase capture range of a digital delay locked loop is extended past ±π (±180 degrees), the digital delay locked loop may tolerate larger clock duty cycle error.

In one or more embodiments, because a phase capture range of a digital delay locked loop is extended past ±π (±180 degrees), more error may be tolerated in process models used for the design of the digital delay locked loop.

In one or more embodiments, because a phase capture range of a digital delay locked loop is extended past ±π (±180 degrees), more error may be tolerated in extraction processes used for the design of the digital delay locked loop.

In one or more embodiments, because a phase capture range of a digital delay locked loop is extended past ±π (±180 degrees), the digital delay locked loop may cover multiple process nodes.

In one or more embodiments, because a phase capture range of a digital delay locked loop is extended past ±π (±180 degrees), the need for software manipulation of the digital delay locked loop is decreased.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   a delay array arranged to generate an output signal that is delayed with respect to an input signal by an amount indicated by a delay code provided to the delay array;
   a shift controller operatively connected to the delay array and arranged to update the delay code dependent on a phase comparison of the input signal and the output signal; and
   a detection circuit arranged to monitor the delay code,
   wherein initial startup and reset values of the delay code are configured such that exceeding one or more boundaries of a ±π (±180 degrees) phase capture range is avoided; and
   wherein exceeding a boundary of the ±π (±180 degrees) phase capture range is detected by the detection circuit, which causes a self-reset of the delay code to a value different than that of a value of the delay code at one of a previous reset and an initial startup of the delay array.

2. The computer system of claim 1, wherein the shift controller comprises the detection circuit.

3. The computer system of claim 1, wherein the shift controller comprises a phase comparator, and wherein the phase comparator is a D flip-flop.

4. The computer system of claim 1, further comprising:
   a shift register arranged to store the delay code and operatively connected to the shift controller.

5. The computer system of claim 1, wherein a value of the self-reset delay code indicates more delay being needed than a value of the delay code at one of the reset and the startup of the delay array.

6. The computer system of claim 1, wherein a value of the self-reset delay code indicates less delay being needed than a value of the delay code at one of the reset and the startup of the delay array.

7. The computer system of claim 1, further comprising:
   a strobe delay line arranged to delay a strobe signal by an amount of delay indicated by the delay code.

8. The computer system of claim 7, further comprising:
   a memory arranged to output the strobe signal to the strobe delay line.

9. The computer system of claim 8, further comprising:
   a buffer having a clock input operatively connected to the delayed strobe signal,
   wherein the memory is further arranged to selectively output data to the buffer.

10. The computer system of claim 1, wherein at least one of the delay array, the shift controller, and the detection circuit are digital.

11. A computer system, comprising:
    means for delaying an input signal to generate an output signal, the means for delaying being dependent on a delay code indicative of an amount of delay by which to delay the input signal;
    means for comparing phases of the input signal and the output signal;
    means for updating the delay code dependent on the means for comparing phases;
    means for monitoring the delay code;
    means for configuring initial startup and reset values of the delay code such that exceeding one or more boundaries of the ±π (±180 degrees) phase capture range is avoided; and
    means for resetting the delay code in response to exceeding a boundary of the ±π (±180 degrees) phase capture range, wherein the delay code is reset to a value different than a value of the delay code present at one of a previous reset and an initial startup of the means for delaying.

12. The computer system of claim 11, further comprising:
    means for storing the delay code.

13. The computer system of claim 11, wherein the means for resetting is configured to reset the delay code to a value indicative of more delay being needed than as indicated by a value of the delay code present at one of the previous reset and the initial startup.

14. The computer system of claim 11, wherein the means for resetting is configured to reset the delay code to a value indicative of less delay being needed than as indicated by a value of the delay code present at one of the previous reset and the initial startup.

15. The computer system of claim 11, further comprising:
    means for delaying an incoming signal from an external memory dependent on the delay code.

16. A method for performing delay locked loop operations, comprising:
    delaying an input signal to generate an output signal, wherein the output signal is delayed with respect to the input signal by an amount indicated by a delay code;
    comparing phases of the input signal and the output signal;
    updating the delay code dependent on the comparing; and
    monitoring the delay code for a predetermined condition,
    wherein initial startup and reset values of the delay code are configured such that exceeding one or more boundaries of the ±π (±180 degrees) phase capture range is avoided; and
    wherein, in response to exceeding a boundary of the ±π (±180 degrees) phase capture range, delay code is reset to a value different than a value of the delay code present at least at one of a previous reset and an initial startup of the delaying.

17. The method of claim 16, wherein the resetting comprises resetting the delay code to a value indicative of more delay being needed than as indicated by a value of the delay code present at least at one of the previous and the initial startup.

18. The method of claim 16, wherein the resetting comprises resetting the delay code to a value indicative of less delay being needed than as indicated by a value of the delay code present at least at one of the previous reset and the initial startup.

19. The method of claim 16, further comprising:
storing the delay code.

20. The method of claim 16, further comprising:
delaying an input strobe signal dependent on the delay code.

* * * * *